(12) United States Patent
Hsu

(10) Patent No.: US 6,798,669 B1
(45) Date of Patent: Sep. 28, 2004

(54) LATCHING STRUCTURE FOR MOTHERBOARDS

(75) Inventor: Cheng-Chung Hsu, Taipei (TW)

(73) Assignee: Inventec Corporation, Taipei (TW)

( * ) Notice: Subject to any disclaimer, the term of this patent is extended or adjusted under 35 U.S.C. 154(b) by 70 days.

(21) Appl. No.: 10/378,838

(22) Filed: Mar. 5, 2003

(51) Int. Cl.⁷ .................................................. H05K 7/12
(52) U.S. Cl. ....................... 361/801; 361/732; 361/726; 361/740; 361/747; 361/759
(58) Field of Search ................................. 361/726, 732, 361/740, 747, 759, 801; 312/222

(56) References Cited

U.S. PATENT DOCUMENTS

| | | | |
|---|---|---|---|
| 5,973,926 A | * | 10/1999 | Sacherman et al. .......... 361/759 |
| 6,362,978 B1 | * | 3/2002 | Boe ............................. 361/825 |
| 6,603,669 B2 | * | 8/2003 | Sheen et al. ................. 361/801 |
| 6,695,629 B1 | * | 2/2004 | Mayer .......................... 439/92 |

* cited by examiner

Primary Examiner—Tulsidas Patel
Assistant Examiner—Dameon E. Levi
(74) Attorney, Agent, or Firm—Birch, Stewart, Kolasch & Birch, LLP

(57) ABSTRACT

A latching structure for a motherboard mainly includes a rotatable clip stem pivotally mounted on an edge of the motherboard. There is a fixing member on the base plate of the casing of a computer processor where the motherboard is installed. When the motherboard is mounted onto the base plate at a selected location, the notch of the clip stem straddles the fixing member. When the clip stem is turned in a selected direction to a selected angle, the clip stem presses the fixing member on the base plate and causes the motherboard to generate a relative displacement to press the inner wall surface of the base plate. By means of such a simple design and structure, the motherboard may be installed or removed without using tools. Thus operation convenience of installation and removal may be enhanced, and cost and time of production may be reduced.

7 Claims, 2 Drawing Sheets

LATCHING STRUCTURE FOR MOTHERBOARDS

FIELD OF THE INVENTION

The invention relates to a connecting structure for structural elements of information products and particularly to a latching structure for installing motherboards without using tools.

BACKGROUND OF THE INVENTION

In this era of ever changing technologies and fierce competition in the market place, the trend of "humanization" in product design has a growing appeal for market promotion. Product "humanization" focuses on every aspect of the product's functions and operations from the user's perspective, and tries to build convenient and user-friendly features in the interactions of users and products.

Similar concepts may also be applied on production processes. In this digital economy, in addition to the accumulation of management knowledge, training of human resources, research and innovation, continuous developments in manufacturing techniques and production management are also critical for the survival of enterprises. These also help to shorten product delivery time, enhance production yield, and improve competitiveness in the market. Hence in the production processes, every operation step of every worker must be highly efficient. Based on these concerns, the concept of "Tool-less" design has been developed. It has quickly become an essential element in industrial design.

For the installation of motherboards for computers and server host processors, the aforesaid concept is still not fully implemented. People still need to move parts by hand to selected positions for fastening with screws in order to install motherboards. Unfastening screws to disassemble the motherboard is also very tedious. Using elements that require tools to operate results in wasted time during testing, repair and maintenance of the motherboards. This is a shortcoming yet to be overcome.

SUMMARY OF THE INVENTION

The invention aims at installing and anchoring motherboards without using tools.

In view of the aforesaid disadvantages, the latching structure for motherboards of the invention mainly includes a fixing member mounted onto a base plate of the computer processor casing and a clip stem pivotally mounted onto the motherboard to generate a rotary displacement. The clip stem has a notch on one end. When the motherboard is at a selected location on the base plate, the notch straddles the fixing member. When the clip stem is turned in a selected direction at a specific angle, the clip stem presses the fixing member of the base plate to move the motherboard to ram against an inner side wall of the base plate.

By means of the invention, the motherboard may be installed without using tools, so assembly and disassembly operations are more convenient, and material costs of the screws may be saved.

The foregoing, as well as additional objects, features and advantages of the invention will be more readily apparent from the following detailed description, which proceeds with reference to the accompanying drawings.

BRIEF DESCRIPTION OF THE DRAWINGS

The invention will become more fully understood from the detailed description given hereinbelow illustration only, and thus are not limitative of the present invention, and wherein.

DESCRIPTION OF THE PREFERRED EMBODIMENT

Figure 1:
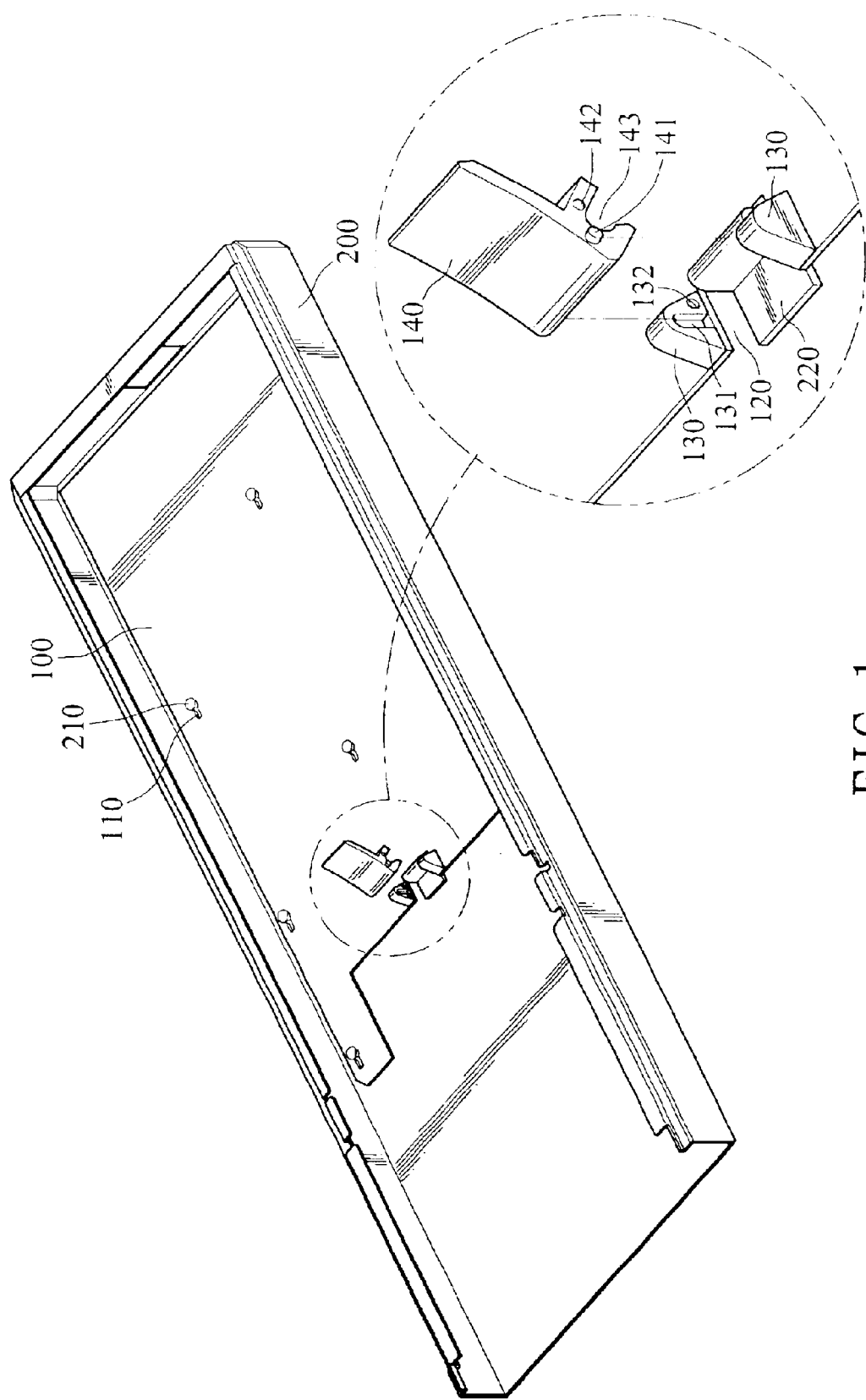
FIG. 1 is an exploded view of an embodiment of the invention.

Refer to FIG. 1 for an embodiment of the invention. A motherboard 100 is to be installed on an inner side of a base plate 200. In order to facilitate explanation, the general electronic elements that exist in the motherboard 100 have been removed. The base plate 200 is a rectangular plate with three upright peripheral edges. The base plate is a portion of the casing (not shown in the drawing) of a computer or server host processor, and is fixedly located on a selected position of the casing. The latching structure of the invention for installing or removing the motherboard without using tools is described as follows.

The motherboard 100 generally has a plurality of longitudinal and elongated anchor holes 110 with varying interior diameters. The base plate 200 has anchor pins 210 corresponding to the anchor holes 110 for coupling, to thereby facilitate initial positioning of the motherboard 100 during installation.

The motherboard 100 has a notch 120 on its left side edge. The notch 120 has a front side and a rear side upon which a base dock 130 is located. The two base docks 130 have one side opposing one other. On each of the opposing sides, there is a trough 131 and a cavity 132. The trough 131 is for holding a stub shaft 141 located on each of two lateral sides of an F-shaped clip stem 140. The clip stem 140 may be turned about the stub shaft 141. The two lateral sides of the clip stem 140 each have a bulged spot 142. When the clip stem 140 is turned to a selected angle, the bulged spot 142 is forced to engage with the cavity 132 of the base dock 130 to anchor the clip stem 140.

The base dock 200 has a fixing member 220 located on a position corresponding to the clip stem 140 when the motherboard 100 is installed. The fixing member 220 is a plate bent to form the shape of an upright wall, and is mounted onto the base plate 200 by soldering or riveting. The F-shaped clip stem 140 has a notch opening 143 straddling the fixing member 220.

Figure 3:
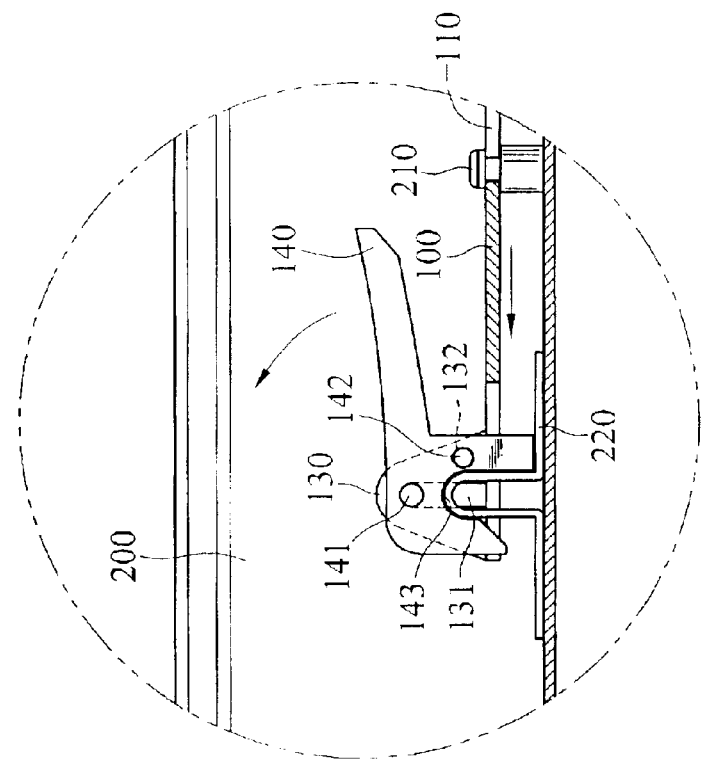
FIGS. 2 and 3 are schematic views of the invention in various operating conditions.
Figure 2:
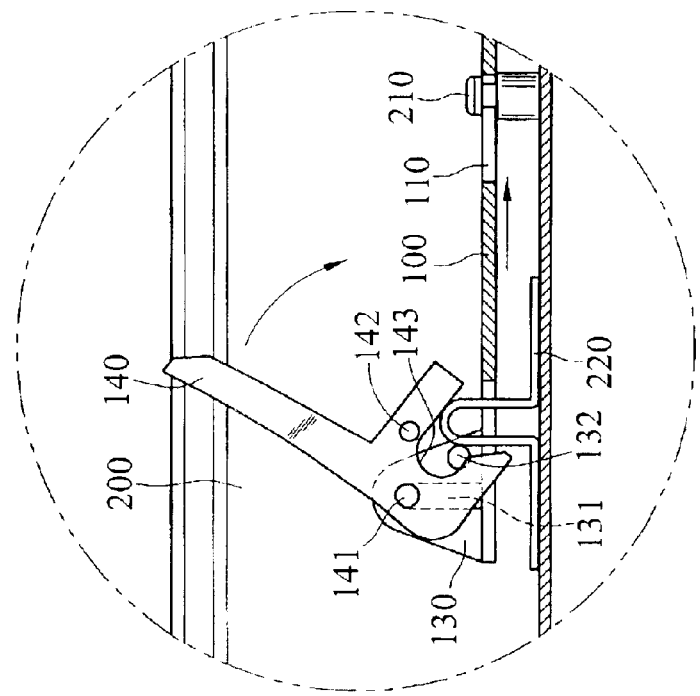

Referring to FIGS. 2 and 3, after the motherboard 100 is mounted onto the base plate 200 by coupling the anchor holes 110 with the anchor pins 210, the tail end of the clip stem 140 on the motherboard 100 is turned downwards through the lever principle. A force is exerted on the clip stem 140 to press the fixing member 220, and the motherboard 100 may be moved until its edge is in close contact with the inner wall surface of the base plate 200. Meanwhile, the bulged spot 142 of the clip stem 140 is forced to engage with the cavity 132 of the base dock 130 to form an anchor.

To remove the motherboard 100, lift the clip stem 140 to separate the bulged spot 142 from the cavity 132 of the base dock 130, and push against the fixing member 220 in the reverse direction. The motherboard 100 may then be returned to its original position.

By means of the foregoing construction and operations, the motherboard 100 may be installed or removed without using tools. This greatly improves convenience for production processes or repairs and maintenance. The cost and assembly time of using conventional screws may be saved.

It is to be noted that the pivotal connection means for the clip stem and the base dock is not limited to the stub shaft/trough approach. Besides switching the positions, other methods such as pivotal insert pins may also be adopted. Moreover, the base dock coupling with a pivotal structure of a greater strength may provide a support effect as well. Furthermore, besides installing the motherboard on the base plate and installing the base plate in the casing of the computer or the server host processor, the motherboard may also be directly installed in certain types of casings. The locations of the bulged spot on the clip stem and the cavity on the base dock may also be switched to achieve the same effect.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments that do not depart from the spirit and scope of the invention.

What is claimed is:

1. A latching structure for a motherboard, comprising:

a fixing member formed in an upright wall being fixedly mounted onto a base plate of a casing of a computer processor, and a clip stem pivotally engaged with at least one base dock, the at least one base dock being located on one side of the motherboard, the motherboard having a notch on one end thereof, the at least one base dock being located on one side of the notch, and the clip stem being rotatable relative to the base dock;

wherein the motherboard is located on a selected position of the base plate with the notch straddling the fixing member such that when the clip stem is turned in a selected direction to a selected angle the clip stem presses the fixing member on the base plate and causes the motherboard to generate a relative displacement to press an inner wall surface of the base plate.

2. The latching structure for a motherboard of claim 1, wherein the clip stem is formed substantially in an F-shape.

3. The latching structure for a motherboard of claim 1, wherein the stem clip has at least one stub shaft located on a lateral side thereof and the base dock has at least one trough for housing the stub shaft.

4. The latching structure for a motherboard of claim 1, wherein the base dock has at least one stub shaft located on a lateral side thereof and the clip stem has at least one trough for housing the stub shaft.

5. The latching structure for a motherboard of claim 1, wherein the fixing member is formed from a plate by bending.

6. The latching structure for a motherboard of claim 1, wherein the clip stem has at least one bulged spot located on a lateral side thereof and the base dock has at least one cavity to engage with the bulged spot when the clip stem is turned to the selected angle to maintain the clip stem at the selected angle.

7. The latching structure for a motherboard of claim 1, wherein the clip stem has at least one cavity located on a lateral side thereof and the base dock has at least one bulged spot to engage with the cavity when the clip stem is turned to the selected angle to maintain the clip stem at the selected angle.

* * * * *